United States Patent [19]

Marcovici et al.

[11] Patent Number: 4,739,307
[45] Date of Patent: Apr. 19, 1988

[54] MULTICHANNEL PREDICTIVE GAIN AMPLIFIER SYSTEM

[75] Inventors: Sorin Marcovici, Arlington; Boris Valski, Lexington, both of Mass.

[73] Assignee: Analogic Corporation, Wakefield, Mass.

[21] Appl. No.: 575,676

[22] Filed: Jan. 31, 1984

[51] Int. Cl.⁴ .............................................. H03M 1/18
[52] U.S. Cl. ......................... 340/347 AD; 340/347 M; 340/347 SH; 330/86; 330/279; 330/282; 370/113
[58] Field of Search ................. 340/347 AD, 347 SH, 340/347 M; 367/65–67; 370/113; 330/86, 279, 282

[56] References Cited

U.S. PATENT DOCUMENTS

| | | | |
|---|---|---|---|
| 3,509,558 | 4/1970 | Cancro | 340/347 AD |
| 3,613,111 | 10/1971 | Paine et al. | 340/347 AD |
| 3,742,489 | 6/1973 | Lefevre et al. | 340/347 AD |
| 3,942,173 | 3/1976 | Wold | 340/347 CC X |
| 4,121,055 | 10/1978 | Doherty | 370/113 |
| 4,232,302 | 11/1980 | Jagatich | 340/347 AD |

OTHER PUBLICATIONS

Zuch, Pick Sample-Holds by Accuracy and Speed—, Electronic Design 26, 20 Dec. 1978, pp. 84–90.
The Engineering Staff of Analog Devices, Inc., Analog-Digital Conversion Handbook, 6/1972, I-2 to I-5; I-29 to I-35; III-2 to III-5.

Primary Examiner—T. J. Sloyan
Attorney, Agent, or Firm—Joseph S. Iandiorio; Douglas E. Denninger

[57] ABSTRACT

A multichannel predictive gain amplifier system including a device for receiving input from a first channel and from a second channel, a variable gain amplifier, and a gain setting circuit for setting the gain of the variable gain amplifier. A switching device responsive to the input from the first and second channels sequentially connects each channel first to the gain setting circuit for determining the desired gain for that channel and then to the variable gain amplifier set to that desired gain.

14 Claims, 2 Drawing Sheets

MULTICHANNEL PREDICTIVE GAIN AMPLIFIER SYSTEM

FIELD OF INVENTION

This invention relates to a multichannel predictive gain amplifier system, and more particularly to such a sytem for optimizing the amplification gain for signal from each channel for sequential sampling and forwarding to an A/D converter.

BACKGROUND OF INVENTION

In conventional adaptive conversion systems a problem arises because of the frequent driving of the amplifier to saturation. When an amplifier is driven to saturation it requires a relatively extended period of time to recover, typically in the area of two to four microseconds. Current data acquisition applications, such as computerized tomography scanners used in cardiovascular investigations, in order to provide heart-stopping imagery, require speed on the order of one microsecond per word throughput. Such systems where saturation could occur and introduce a two- to four-microsecond recovery time delay are therefore intolerable.

SUMMARY OF INVENTION

It is therefore an object of this invention to provide an improved high-speed multichannel predictive gain amplifier system for use in adaptive converters.

It is a further object of this invention to provide such a system which prevents delays due to saturation of amplifiers.

It is a further object of this invention to provide such a system which increases the total data throughput rate.

This invention results from the realization that a truly effective multichannel predictive gain amplifier system and adaptive converter using such a system can be achieved by providing sequential switching of incoming signals to first determine the desired gain for that signal and then to amplify that signal at that gain to prevent amplifier saturation and to provide pipelining of the output signals to increase the data word throughput rate.

The invention features a multichannel predictive gain amplifier system. There are means for receiving input from a first channel and from a second channel. There is a variable gain amplifier and a gain setting circuit for setting the gain of the variable gain amplifier. Switching means responsive to the input from the first and second channels sequentially connects each channel, first to the gain setting circuit for determining the desired gain for that channel, and then to the variable gain amplifier set to that desired gain.

The invention also features a multichannel adaptive conversion system including the multichannel predictive gain amplifier system in combination with means for sampling and holding the sequential signals from the first and second channels from the variable gain amplifier. There is an analog to digital converter responsive to the means for sampling and holding for converting to digital signals the analog signals from the first and second channels. The means for sampling and holding may include first and second sample and hold circuits for sampling and holding the signals from the first and second channels, respectively. There may be output switching means for sequentially passing the sampled and held signals from the first and second channels, respectively.

The means for receiving may include first and second input terminals, one associated with each channel, and may also include first and second buffer amplifiers, one associated with each input terminal. The gain setting circuit may include a reference circuit for establishing a plurality of gain levels, a gain control circuit for setting the gain level of the variable gain amplifier, and comparator means, responsive to the reference circuit and responsive to a signal from one of the first and second channels, for selecting one of the plurality of gain levels to be set by the gain control circuit.

DISCLOSURE OF PREFERRED EMBODIMENT

Other objects, features and advantages will occur from the following description of a preferred embodiment and the accompanying drawings, in which.

Figure 1:
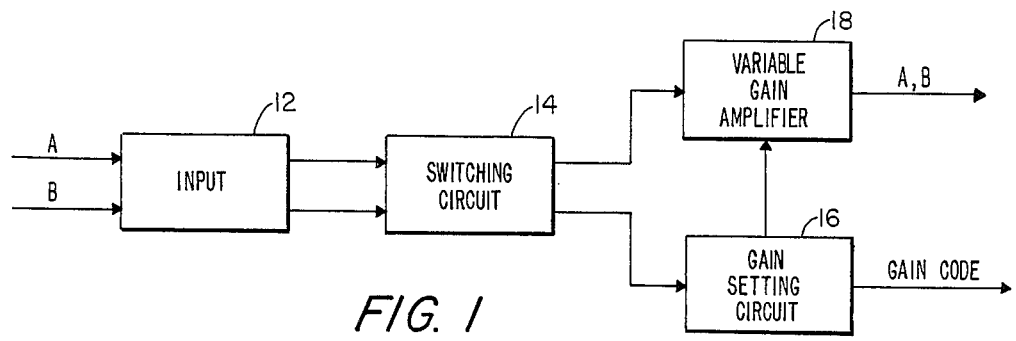
FIG. 1 is a simplified block diagram of a multichannel predictive gain amplifier system according to this invention.

There is shown in FIG. 1 a multichannel predictive gain amplifier system 10 according to this invention. Analog input signals, such as those derived from the detectors of a computerized tomography scanner, are provided on a number of channels, such as channels A and B, to some input means 12. Channels A and B are received by switching circuit 14, which provides the signal on each channel first to gain setting circuit 16, for determining the desired gain for that channel, and then to the variable gain amplifier 18, which has been set to the gain determined by gain setting circuit 16. The gain setting is the highest value gain available for the signal without driving amplifier 18 into saturation. The amplified signals of channels A and B are provided ultimately at the output of amplifier 18.

Figure 2:
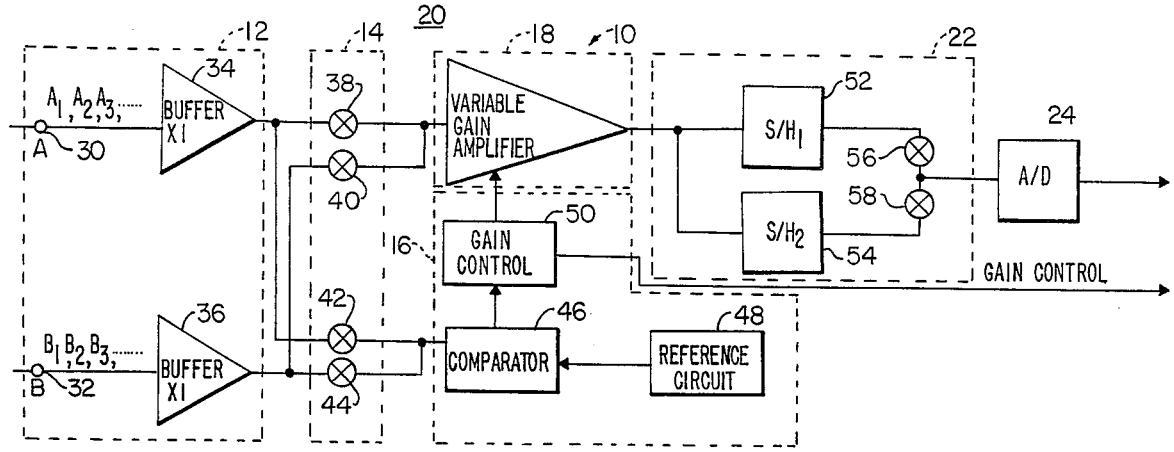
FIG. 2 is a more detailed view of the multichannel predictive gain amplifier system of FIG. 1 in an adaptive conversion system according to this invention.

Multichannel adaptive conversion system 20, FIG. 2, includes multichannel predictive gain amplifier system 10 combined with a sample and hold circuit 22 and A/D converter 24. Input means 12 may include input terminals 30 and 32. Terminal 30 receives signals $A_1$, $A_2$, $A_3$, ..., on channel A, and terminal 32 receives signals $B_1$, $B_2$, $B_3$, ..., on channel B. Receiving means 12 may alternatively include buffer amplifiers 34 and 36. Switching circut 14 includes a pair of switches 38 and 40, which control the outputs from amplifiers 34 and 36, respectively, to variable gain amplifier 18, and a pair of switches 42 and 44, which control the outputs from amplifiers 34 and 36, respectively, to comparator 46 in gain setting circuit 16. Comparator circuit 46 compares the incoming signal from switch 42 or 44 with signals from reference circuit 48 to establish a gain in gain control 50 to set the gain in variable gain amplifier 18. The output of variable gain amplifier 18 is sampled alternately by sample and hold circuits 52 and 54 which, alternately through switches 56 and 58 respectively, provide their outputs to A/D converter 24.

Figure 3:
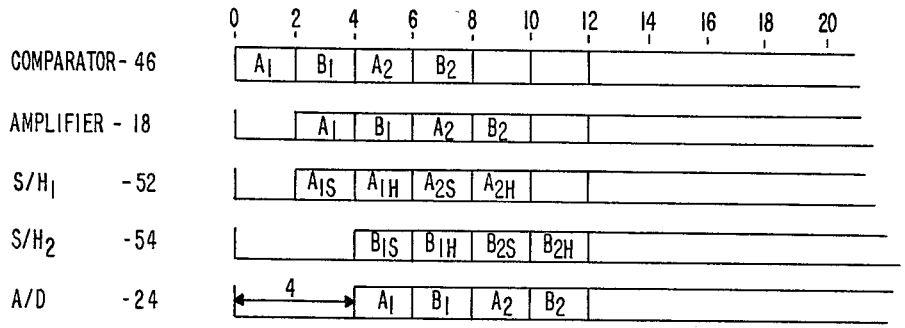
FIG. 3 is a timing chart illustrating the operation of the system of FIG. 2.

The operation of adaptive conversion system 20 is understood mor readily with reference to the timing chart of FIG. 3, which is divided horizontally into two microsecond intervals beginning with zero and going through 26 microseconds, showing the signals present at various times at comparator 46, amplifier 18, sample and hold circuits 52 and 54, and A/D converter 24. In operation, with signal $A_1$ provided to amplifier 34, switch 38 is opened and switch 42 is closed so that signal $A_1$ is fed to comparator 46, where a determination is made as to the proper setting of variable gain amplifier 18 for the amplitude of signal $A_1$. When this determination is made the gain setting is stored in gain control 50. This period of operation is represented by the label $A_1$ in the first and second segments of the chart for comparator 46 in FIG. 3. Next the gain setting established in gain control 50 is set on amplifier 18 and switch 38 is closed. Switch 42 is opened and switch 44 is closed, so that now in the time period 2–4 microseconds, comparator 46 is receiving $B_1$ and determining the proper gain setting for it while amplifier 18 is receiving signal $A_1$ for which its gain has already been preset. For the same period, sample and hold circuit 52 samples the $A_1$ signal. During the next time slot, from 4–6 microseconds, the second signal on channel A, signal $A_2$, is fed through amplifier 34 and switch 42 to comparator 46 for a determination of the necessary gain. At the same time signal $B_1$ from amplifier 36 is now fed through switch 40 to amplifier 18, which has been set with the proper gain for signal $B_1$. In the same time period, 4–6 microseconds, the sample and hold circuit 52 now holds the $A_1$ signal, and the $B_1$ signal is being sampled by sample and hold circuit 54. Simultaneously, the $A_1$ signal held in sample and hold circuit 52 has been delivered through switch 56 to A/D converter 24, which is digitizing that signal while switch 58 is opened. In the next time slot, 6–8 microseconds, signal $B_2$ is delivered through switch 44 to comparator 46 while signal $A_2$ is delivered through switch 38 to amplifier 18. Signal $A_2$ is now sampled by sample and hold circuit 52, while signal $B_1$ is being held by sample and hold circuit 54. Signal $B_1$ is now being delivered through switch 58 to A/D converter 24 while switch 56 is opened. The system continues to operate in this mode so that there is a signal provided to A/D converter 24 every two microseconds: due to the pipelining effect afforded by the sequencing of switches 38, 40, 42 and 44, a signal appears at the output only every two microseconds, one half the normal four-microsecond period is required for a signal from either channel to propagate through the system. During each switching cycle, the new gain level which has been set in amplifier 18 is stored in gain control 50 so that a gain of unity can be set in amplifier 18 for the brief period during which the change of state of switches 38, 40, 42 and 44 takes place in order to minimize the potential for any transients which might drive amplifier 18 to saturation.

Figure 4:
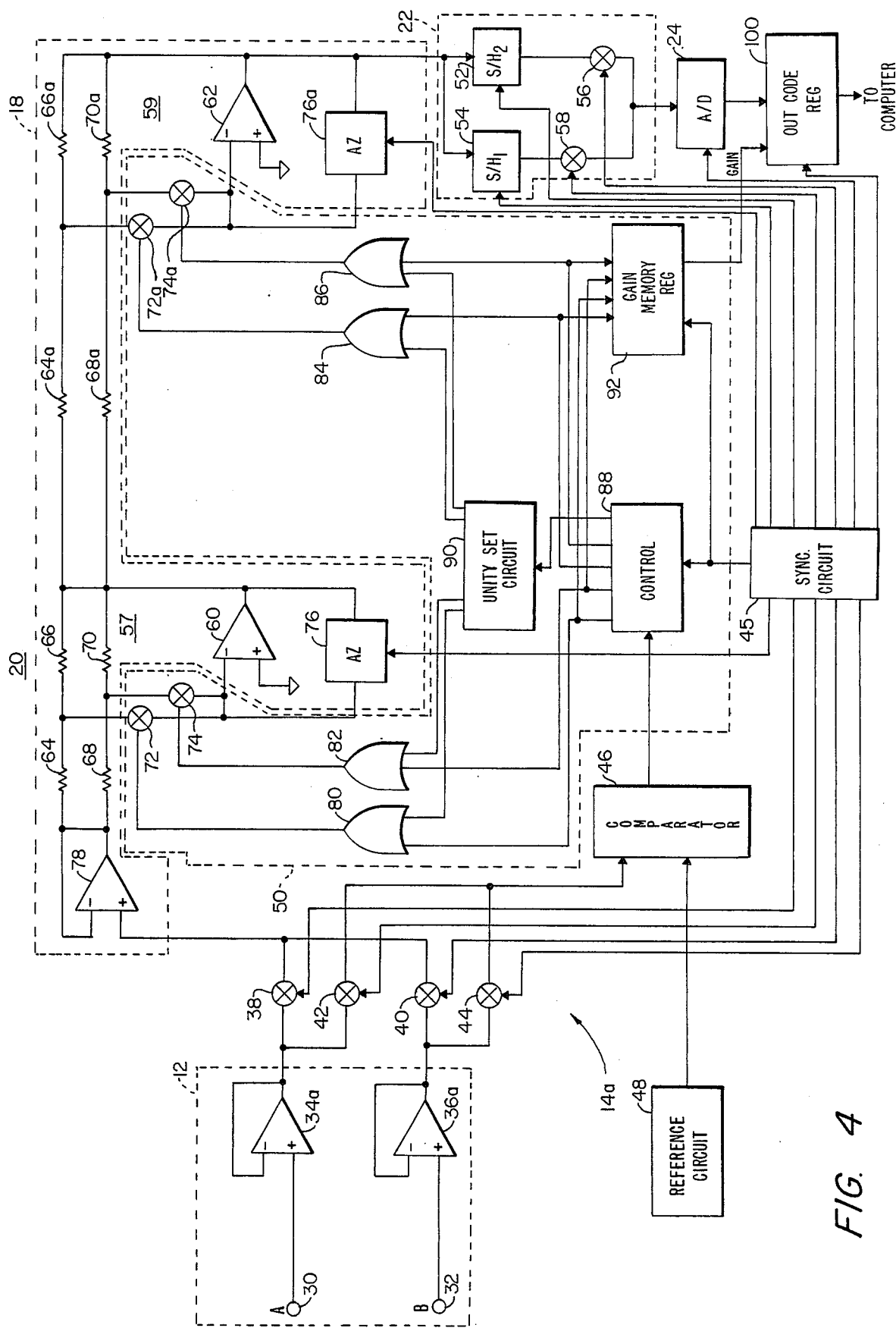
FIG. 4 is a more detailed circuit diagram of the system of FIG. 2.

A more detailed circuit diagram of the adaptive conversion system 20 of FIG. 2 is shown in FIG. 4, where the buffer amplifiers are implemented with operational amplifiers 34a and 36a. Switching circuit 14a includes switches 38, 40, 42 and 44 and a synchronizing circuit 45, which operates those switches as well as switches 56 and 58 every two microseconds and establishes the timing for various other components of the system.

Variable gain amplifier 18 includes two stages of amplification 57, 59, each including an amplifier 60, 62. Associated with amplifier 60 is a first input resistor 64 and first feedback resistor 66, and a second input resistor 68 and second feedback resistor 70. The junction of resistors 64 and 66 is connected to the inverting input of amplifier 60 through switch 72. The junction of resistors 68 and 70 is also connected to the inverting input of amplifier 60 through switch 74. The non-inverting input is connected to ground. An auto-zero circuit 76 is used to compensate for the offset error of the amplifier. Associated with amplifier 62 are similar resistors 64a, 66a, 68a, and 70a, and switches 72a and 74a. There is also provided an auto zero circuit 76a. The input from switches 38 and 40 is introduced to the stages of the variable gain amplifier 18 through an additional buffer amplifier 78. Each stage of amplification is capable of a number of different gains. In this specific example, each of them is capable of unity gain or a gain of 1, and a gain of 8. When switch 72 is closed and switch 74 is open, the gain is 1; when switch 74 is closed and switch 72 is open, the gain is 8. Thus the output of amplifiers 60 and 62 can be each unity; amplifier 60 can provide unity gain and amplifier 62 a gain of 8; or amplifier 60 can provide a gain of 8 and amplifier 62 a gain of unity; or each amplifier can provide a gain of 8. The combined output then would provide a gain of either unity, 8, 8, or 64. One of the switch patterns would not be used, so that there would be three gains available: unity, 8, and 64. The gain values are not limited to 8's or mulitiples thereof; they can be any gain that is selected by the choice of the resistors 64 and 66. The gains of 8 and 64 are chosen here because they are powers of 2, easier to be processed by a binary system. The invention is not limited to two stages of amplification: three or more might also be used.

Gain control circuit 50 includes four OR gates 80, 82, 84 and 86, which provide the switching signals to switches 72, 74, 72a and 74a. Upon receipt of a signal from comparator 46, control circuit 88 determines the proper gain, in this example either unity, 8 or 64. It then applies switching signals to the proper OR gates 80, 82, 84 and 86 to connect the correct resistor pairs to each amplifier to obtain that gain. When a unity gain is called for by the output of comparator 46 or by synchronizing circuit 45, indicating that a switching cycle is about to occur, control 88 drives unity set circuit 90 to signal OR gates 80, 82, 84 and 86 to close switches 72 and 72a and open switches 74 and 74a. Control 88 also provides the current gain to gain memory register 92, where it is stored for four microseconds The four microsecond delay is required because it takes two microseconds for the switching cycle and an additional two microseconds for the sample and hold cycle, so that the signal now being controlled by the switches will not arrive at the output of A/D converter 24 until four microseconds later. At that time the computer will be provided with the gain which applied to the particular digitized signal that it is now acquiring from output code register 100, which also stores the output from A/D converter 24. Gain memory register 92 introduces a delay which is determined by the speed of the system. Since this embodiment is a two-microsecond system with two channels, there is a four microsecond delay. Output code register 100 may be implemented with a latch circuit which stores both the signal and the gain established for that signal for acquisition by the computer. By combining two of such voltage controlled gain amplifiers, a one-microsecond-per-word throughput can be attained using only a set of latches.

Figure 5:
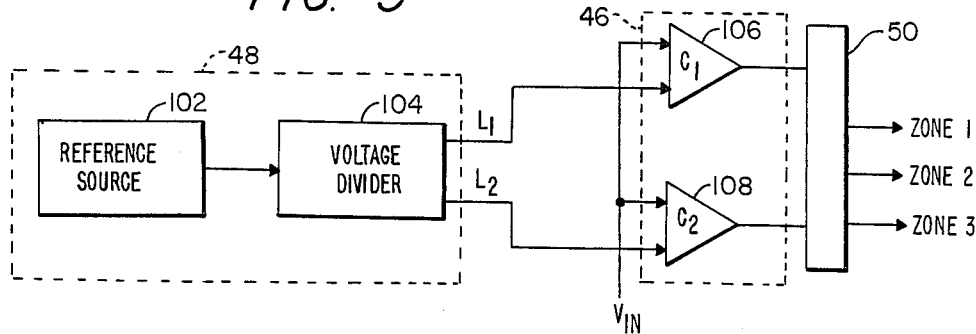
FIG. 5 is a more detailed diagram of the comparator and reference circuit of FIGS. 2 and 4.

Reference circuit 48, FIG. 5, includes a source 102 of reference voltage, and a voltage divider 104, which divides the reference voltage into two reference voltages $L_1$, $L_2$. These voltages $L_1$, $L_2$ are submitted to comparator 46, which includes comparator circuits 106, 108. Their outputs are provided to gain control 50, which defines a number of zones, e.g. Zone 1, Zone 2, Zone 3, that may be used to set the gain at 1, 8 and 64, respectively.

Other embodiments will occur to those skilled in the art and are within the following claims:

What is claimed is:

1. A multichannel predictive gain amplifier system comprising:
   means for receiving input from a first channel and from a second channel;
   a variable gain amplifier;
   a gain setting circuit for setting the gain of said variable gain amplifier;
   switching means, responsive to said input from said first and second channels, for sequentially connecting each channel first to said gain setting circuit for determining the desired gain for that channel and then to said variable gain amplifier set to that desired gain; and
   means for sampling and holding the sequential signals from said first and second channels from said variable gain amplifier.

2. The system of claim 1 in which said means for receiving includes first and second input terminals, one associated with each channel.

3. The system of claim 2 in which said means for receiving further includes first and second amplifiers, one associated with each input terminal.

4. The system of claim 1 in which said means for sampling and holding includes first and second sample and hold circuits for sampling and holding the signals from said first and second channels, respectively.

5. The system of claim 4 in which said means for sampling and holding further includes output switching means for sequentially passing the sampled and held signals from said first and second channels, respectively.

6. The system of claim 1 in which said gain setting circuit includes a reference circuit for establishing a plurality of voltage threshold levels, a gain control circuit for setting the gain level of said variable gain amplifier, and comparator means, responsive to said reference circuit and responsive to a signal from one of said first and second channels, for selecting one of the plurality of gain levels to be set by said gain control circuit.

7. A multichannel adaptive conversion system comprising:
   means for receiving input from a first channel and from a second channel;
   a variable gain amplifier;
   a gain setting circuit for setting the gain of said variable gain amplifier based on the magnitude of sequential signals from said first and second channels;
   switching means, responsive to said input from said first and second channels, for sequentially connecting each channel first to said gain setting circuit for determining the desired gain for that channel and then to said variable gain amplifier set to that desired gain;
   means for sampling and holding the sequential signals from said first and second channels form said variable gain amplifier; and
   analog to digital converter means responsive to said means for sampling and holding for converting to digital signals the analog signals from said first and second channels.

8. A multichannel predictive gain amplifier system comprising:
   means for receiving input from a first channel and from a second channel;
   a variable gain amplifier;
   a gain setting circuit for setting the gain of said variable gain amplifier, said gain setting circuit including a reference circuit for establishing a plurality of voltage threshold levels, a gain control circuit for setting the gain level of said variable gain amplifier, and comparator means, responsive to said reference circuit and to a signal from one of said first and second channels, for selecting one of the plurality of gain levels to be set by said gain control circuit;
   switching means, responsive to said input from said first and second channels, for sequentially connecting each channel first to said gain setting circuit for determining the desired gain for that channel and then to said variable gain amplifier set to that desired gain;
   said gain setting circuit further including means for decreasing the gain of said variable gain amplifier while said switching means changes connection of said first and second channels; and
   means for sampling and holding the sequential signals from said first and second channels from said variable gain amplifier.

9. The system of claim 8 in which said means for receiving includes first and second input terminals, one associated with each channel.

10. The system of claim 9 in which said means for receiving further includes first and second amplifiers, one associated with each input terminal.

11. The system of claim 8 in which said means for decreasing the gain includes means for setting said gain to unity while said switching means changes connection.

12. The system of claim 8 further including analog to digital converter means, responsive to said means for sampling and holding, for converting to digital signals the analog signals from said first and second channels.

13. The system of claim 8 in which said means for sampling and holding includes first and second sample and hold circuits for sampling and holding the signals from said first and second channels, respectively.

14. The system of claim 13 in which said means for sampling and holding further includes output switching means for sequentially passing the sampled and held signals from said first and second channels, rsepectively.

* * * * *